(12) United States Patent
Francis et al.

(10) Patent No.: US 6,683,331 B2
(45) Date of Patent: Jan. 27, 2004

(54) TRENCH IGBT

(75) Inventors: Richard Francis, Manhattan Beach, CA (US); Chiu Ng, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 75 days.

(21) Appl. No.: 10/132,549

(22) Filed: Apr. 25, 2002

(65) Prior Publication Data

US 2003/0201454 A1 Oct. 30, 2003

(51) Int. Cl.⁷ .............................. H01L 29/74
(52) U.S. Cl. ...................... 257/163; 257/330
(58) Field of Search .................. 257/586, 330, 257/107, 162, 163, 164, 165, 166

(56) References Cited

U.S. PATENT DOCUMENTS 5,631,494 A * 5/1997 Sakurai et al. .............. 257/572
6,118,150 A * 9/2000 Takahashi ................... 257/341
2001/0023960 A1 * 9/2001 Soga et al. .................. 257/330

FOREIGN PATENT DOCUMENTS

JP 04317375 A * 11/1992

* cited by examiner

Primary Examiner—Wael Fahmy
Assistant Examiner—Dana Farahani
(74) Attorney, Agent, or Firm—Ostrolenk, Faber, Gerb & Soffen, LLP

(57) ABSTRACT

An IGBT has parallel spaced trenches lined with gate oxide and filled with conductive polysilicon gate bodies. The trenches extend through a P⁻ base region which is about 7 microns deep. A deep narrow N⁺ emitter diffusion is at the top of the trench and a shallow P⁺ contact diffusion extends between adjacent emitter diffusions. The N⁺ emitter diffusions are arranged to define a minimum $R_{B'}$. The trenches are sufficiently deep to define long channel regions which can withstand a substantial portion of the blocking voltage of the device. A second blanket emitter implant and diffusion defines a shallow high concentration emitter diffusion extension at the top of the die for improved contact to the emitter diffusions.

33 Claims, 7 Drawing Sheets

TRENCH IGBT

FIELD OF THE INVENTION

This invention relates to Insulated Gate Bipolar Transistors (IGBTs) and more specifically relates to an IGBT employing a trench topology.

BACKGROUND OF THE INVENTION

IGBTs are well known and are frequently implemented with a planar cellular or stripe topology. These devices have an inherent JFET which increases the device on-resistance $R_{DSON}$ and, thus the forward voltage drop $V_{ce(ON)}$. Further, such devices have an inherent four layer parasitic thyristor structure which will latch on if the NPN transistor of the thyristor turns on.

It is known that IGBTs can be made with a trench topology which eliminates the inherent JFET of the planar device. However, trench IGBTs still have the inherent four layer device whereby, if the inherent NPN transistor in the four layer device turns on (if the current through $R_{B'}$ is sufficiently high), the device will latch on. It is also desirable to reduce the saturation current of the device without increasing the value of $R_{B'}$.

It has further been found that trench IGBTs tend to be "fragile," that is, they can fail when switching an inductive load. This is sometimes termed a low safe operating area (SOA) under reverse bias. This problem again is aggravated by an increased $R_{B'}$

BRIEF DESCRIPTION OF THE INVENTION

In accordance with the invention, a novel trench IGBT structure and process for its manufacture is provided, creating a non-punch through (NPT) IGBT having a reduced $R_{B'}$, a reduced saturation current, a low threshold voltage $V_T$ and an enlarged SOA. More specifically, a novel structure is provided having a deep emitter diffusion which is very narrow (of small lateral extent) to reduce $R_{B'}$. Further, a very deep P channel diffusion is employed between spaced trenches to create a very long inversion channel. Thus, when the device goes into avalanche, the path for hole current under the emitter has a reduced lateral extent, reducing $R_{B'}$; and the trench is very deep (about 8 microns) so that the P region adjacent the channel can support reasonable voltage and the N⁻ body concentration and depth can be optimized. The increased depth of the emitter along the trench controls threshold voltage since it permits the use of a very deep P⁺ region without the danger of its encroaching into the channel (which would increase $V_T$). Finally, a helium implant may be employed for lifetime killing in only the P well.

Further, the device of the invention may be built in float zone silicon and no epitaxial layer is needed, with a weak anode structure being employed as in copending application Ser. No. 09/565,922, filed May 5, 2000 in the names of Richard Francis and Chiu Ng.

DETAILED DESCRIPTION OF THE PREFERRED EMBODIMENTS

Figure 1:
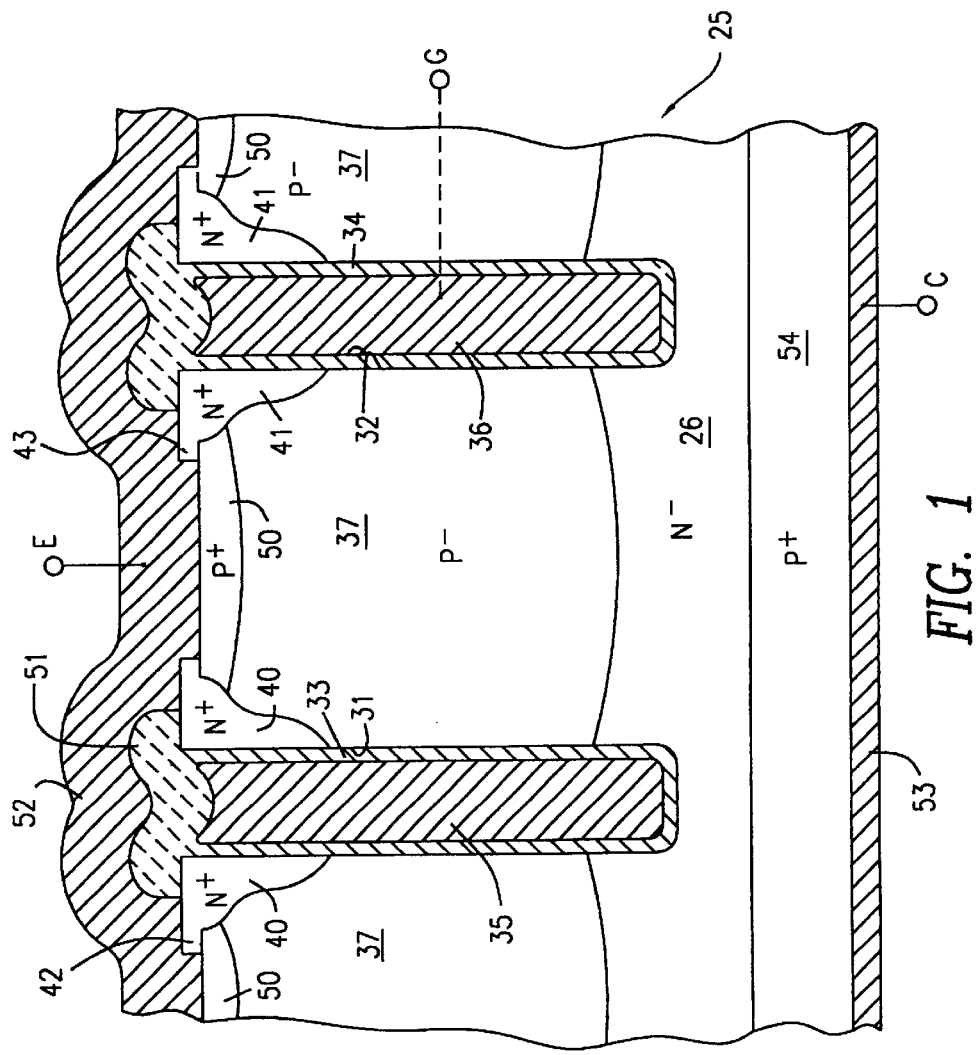
FIG. 1 is a cross-section through two adjacent trenches of an IGBT trench die having the novel junction pattern of the invention.

Referring first to FIG. 1, there is shown a pair of adjacent "cells" (which may be elongated stripes or spaced polygonal elements) in the active area of a device formed in accordance with the invention. The cells are two of up to many thousands in a single die, and are formed with the die in the wafer stage. The terms die and wafer may be used interchangeably in the following description.

The novel structure of FIG. 1 is formed in a common starting wafer 25 of float zone material. However, epitaxial wafers can also be used. The wafer 25 has an N⁻ body which receives adjacent deep trenches 31 and 32 which are lined with thin (for example 1000 Å) silicon dioxide gate insulation layers 33, 34 respectively and are filled with conductive polysilicon gates 35 and 36 respectively which are interconnected (not shown) and have an external gate terminal G, schematically shown. Trenches 31 and 32 may be about 1.5 microns wide, spaced by about 5 to 10 microns and may have a depth of 4 to 9 microns, and preferably about 6.5 microns. These extend through a P⁻ base diffusion 37 which, at the trench region, is about 5 microns deep (as measured from the top surface of the silicon) for an 8 micron deep trench.

Trenches 31 and 32 extend through N⁺ emitter regions 40 and 41 respectively which are very deep), (2 microns to 4 microns) and have a very short lateral extension, for example (1.5 microns to 3 microns). Note that emitter regions 40 and 41 which have shallow shelf contact regions 42 and 43 respectively, which have a lateral extension of about 0.2 microns to 0.5 microns.

Figure 1A:
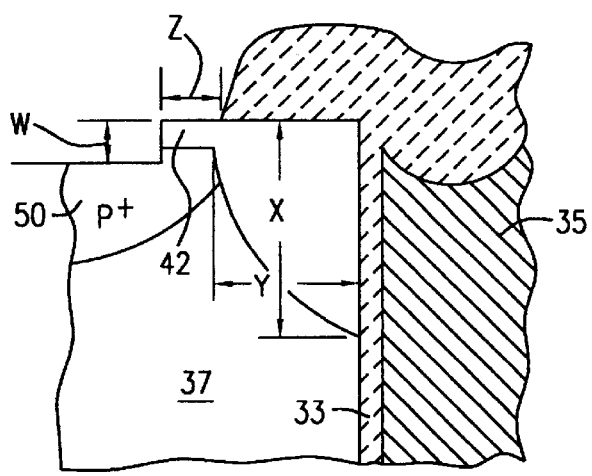
FIG. 1A is an enlarged view of the emitter region of FIG. 1.

The critical dimensions of the novel emitter shape are shown in FIG. 1A, and are:

W=0.2 to 0.5 microns
X=2 to 4 microns
Y=1.5 to 3 microns
Z=0.3 to 1.0 microns

A P⁺ contact region 50 extends into P⁻ base 37 and between emitter regions 40 and 41. The polysilicon gates 35 and 36 are covered by a suitable insulation oxide 51 and the top surface of the device receives an aluminum or other suitable emitter contact 52. The backside of the device contains a P+ diffusion 54 which receives collector contact 53.

The use of the very deep trench (6.5 microns) and very deep P− base 37 (7 microns) permits the use of the very deep, but narrow emitter regions 40 and 41 while still leaving a sufficiently long invertible channel below the emitter regions (for example, 2 microns) to permit the P regions 37 to support a reasonable voltage and so that the N− body 26 can be optimized. Further, when the device operates in avalanche, a hole current flows from P+ region 54 and up and under the emitters 40 and 41 and through the effective resistance $R_{B'}$ under the very narrow distance "Y" of FIG. 1A (which is under emitter regions 40 and 41). This resistance is very low to avoid the turn on of the NPN transistor 40, 37, 26, for example, and to avoid latching on the IGBT structure.

Note that the ledge regions 42, 43 of emitters 40 and 41 respectively are atop the P+ regions 50 and do not form a part of the $R_{B'}$ of the device. These ledges 42, 43, however, are major points for connection of the emitter regions 40 and 41 to emitter contact and permit such connection even with unavoidable mask misalignment during manufacture.

FIGS. 2 through 13 show the major and novel manufacturing steps used to make the device of the invention. Elements which are the same as those of FIGS. 1 and 1A are identified by the same numerals.

FIG. 1 shows die 25 of any suitable starting material. Thus, for a 1200 volt device, a float zone wafer of N− conductivity type and a resistivity of 52.5 ohm cm and thickness of 525 microns can be used.

Figure 2:
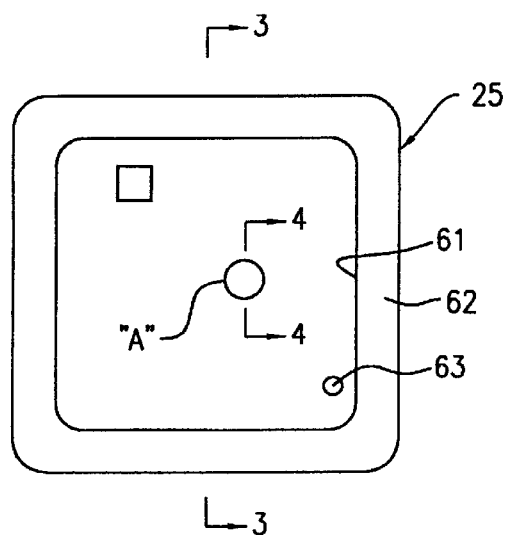
FIG. 2 is a top view of a single chip or die in a wafer containing many identical die which are to be processed in accordance with the invention.

The first basic step shown in FIGS. 1 and 2 is the oxidation of the wafer surface (a 7000 Å thick oxide) and the lithographic formation of an opening 61 in oxide 62, defining a P tub mask (which contains the device active area).

Figure 3:
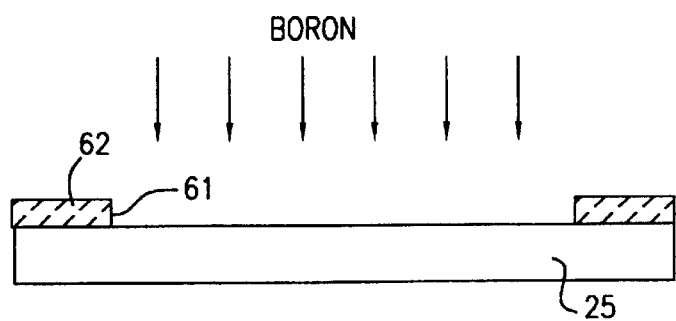
FIG. 3 is a cross-section of FIG. 2 taken across section line 3—3 in FIG. 2.
Figure 4:
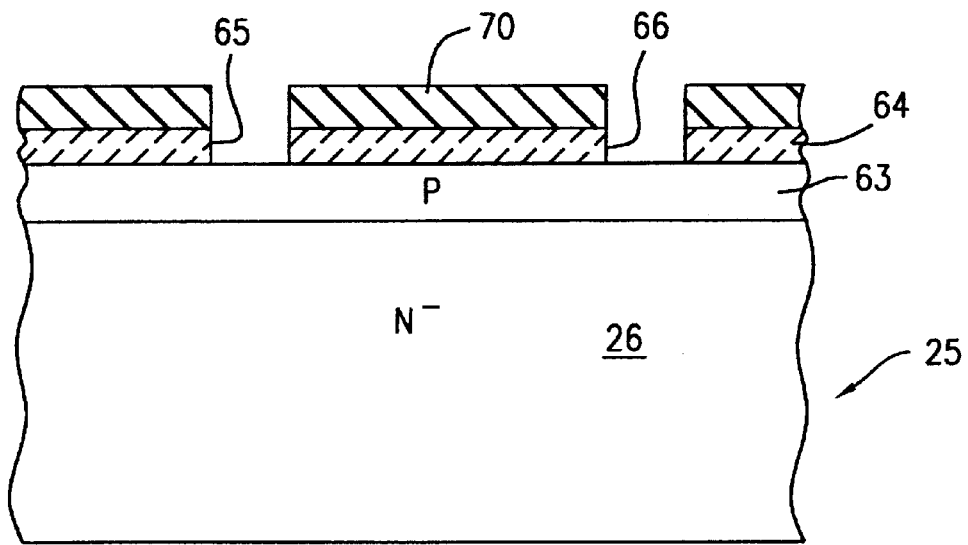
FIG. 4 shows a small section "A" of the active P tub of FIG. 2 and shows the structure after a boron implant and a trench mask operation.

Thus, as shown in FIG. 3, a boron implant is carried out at about $1E14$ ions/cm² at 80 KeV to form P region 63 (FIG. 4). It will be noted that this region 63 deepens with each succeeding thermal treatment, ultimately defining deep P− region 37 of FIG. 1.

The boron implant of region 63 was driven at about 1175° C. for about 60 minutes and an oxide 64 is grown during this drive (FIG. 4). Any suitable termination can be then formed around the periphery of the P tub.

Figure 5:
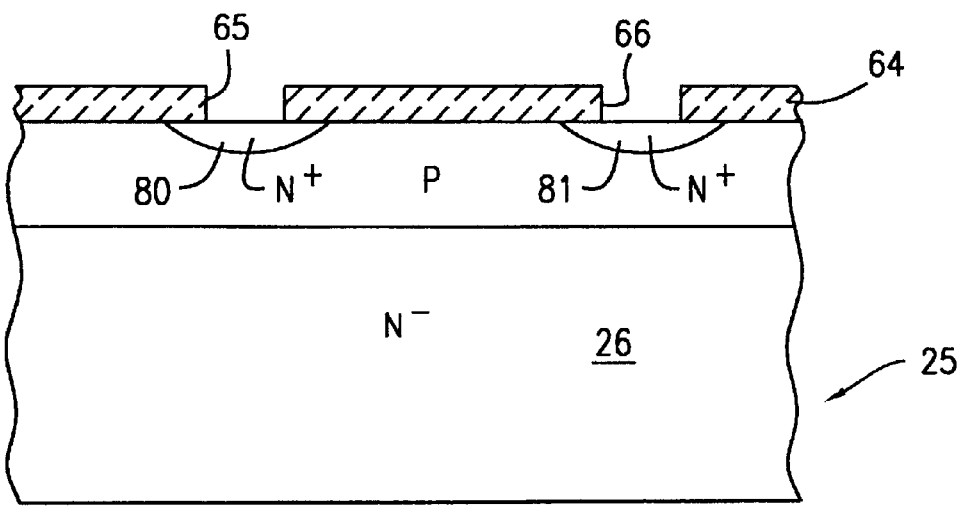
FIG. 5 shows the structure of FIG. 4 after an arsenic implant, forming the emitter regions of the device.

A trench mask 70 of FIG. 5 is then deposited atop oxide 64 and is photolithographically processed as shown in FIG. 4 to form windows 65, 66 in layer 64. The trench windows 65, 66 may be elongated parallel stripes spaced from one another, center to center by about 5 to 10 microns. The windows may be about 1.5 microns wide.

The oxide is etched and the photoresist 70 is then stripped and an emitter implant is carried out with arsenic at a dose $1E16$ ions/cm² and at an energy of about 120 keV. This implant is then annealed or activated, at 975° C. for 10 minutes in $O_2$ and at 1175° C. in $N_2$ for 30 minutes, forming N+ emitter regions 80, 81 in FIG. 5.

Figure 6:
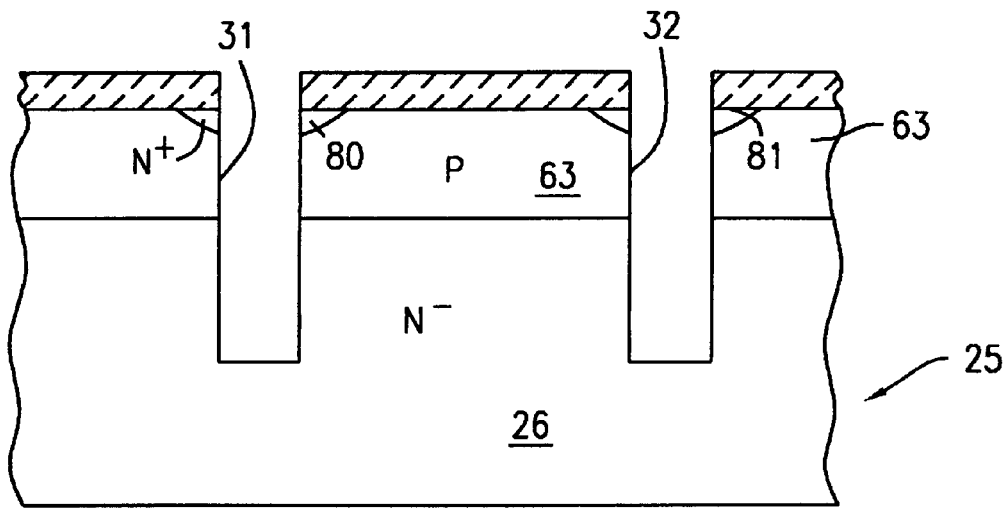
FIG. 6 shows the structure of FIG. 5 after the formation of deep trenches through the emitter regions.

As next shown in FIG. 6 a trench etch is carried out, forming trenches 31 and 32 to a depth of 4 to 9 microns, and to a preferred target of about 6.5 microns. Trenches 31 and 32 cut through the centers of emitter implants 31 and 32. A source drive is then carried out to drive regions 80 and 81 to begin defining emitter regions 40 and 41 of FIGS. 1 and 1A. Note also that the P region 63 is deepening during these thermal treatments.

Next, an active mask step is carried out, followed by an oxide etch to remove the masking oxide and the oxide on the side wall and to clean up the trench; and photoresist strip.

Figure 7:
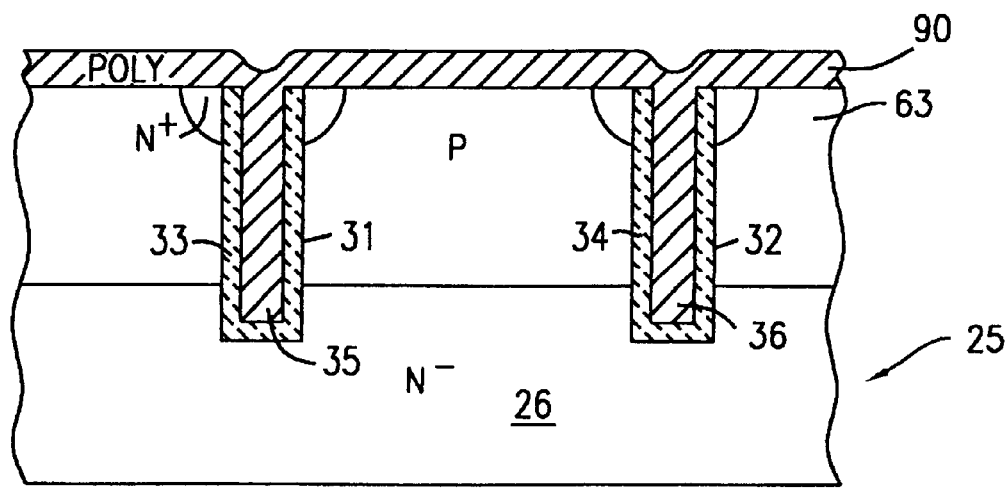
FIG. 7 shows the structure of FIG. 6 after trench gate oxidation and filling with polysilicon.

Thereafter, and as shown in FIG. 7, a gate oxidation step is carried out at 1050° C. for 45 minutes in $O_2$ to grow gate oxide layers 33 and 34 in the trenches 31 and 32 to thicknesses of about 1000 Å.

Polysilicon layer 90 is next deposited to a thickness of about 1.0 micron, and fills the trenches 31, 32 with polysilicon fillers 35, 36 respectively. The polysilicon is made conductive, as by using a subsequent phosphorus oxychloride deposition and drive.

Figure 8:
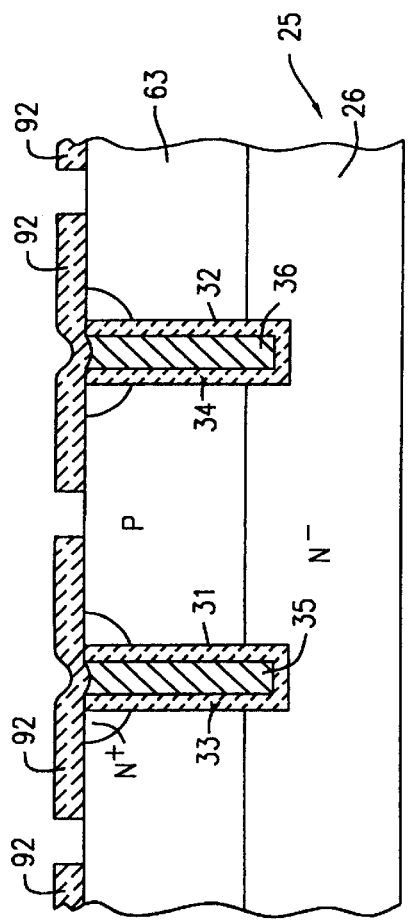
FIG. 8 shows the structure of FIG. 7 after a polysilicon etch and the formation of a mask for a P⁺ implant
Figure 9:
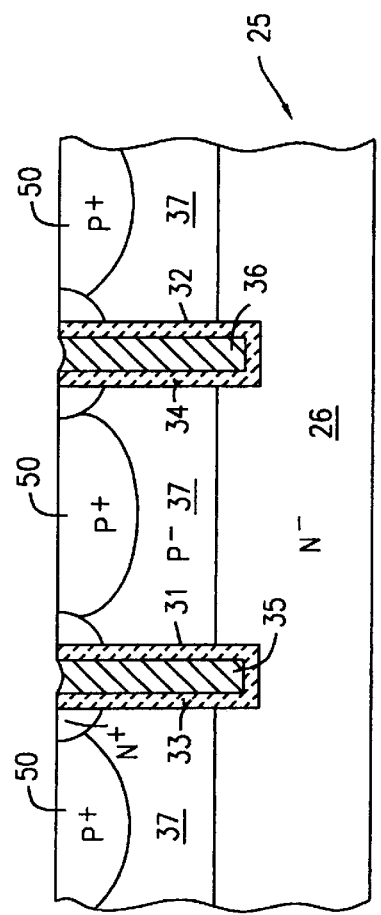
FIG. 9 shows the structure of FIG. 8 after a P⁺ implant.

As next shown in FIG. 8, and after deglassing, a P+ mask 92 is formed and windows opened as shown for a P+ implant of boron at $6E15$ ions/cm² and at 150 keV. This implant is later driven at 975° C. for 10 minutes in $O_2$ and at 1175° C. for 45 minutes in $N_2$, to form the "$R_{B'}$" diffusions 50 in FIG. 9.

Figure 10:
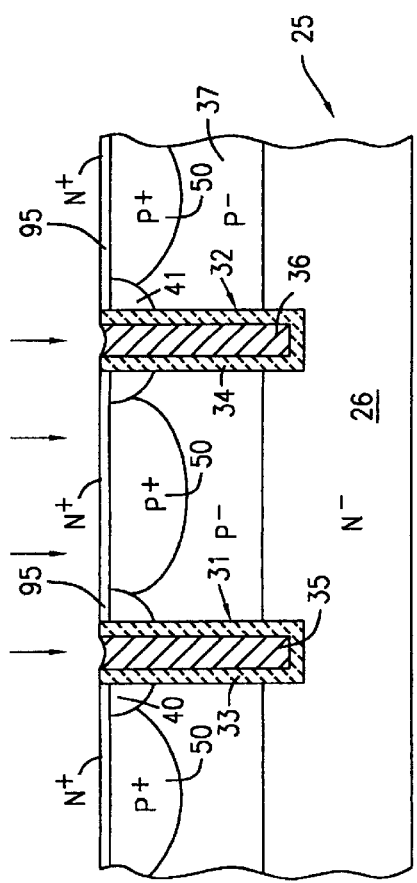
FIG. 10 shows the structure of FIG. 9 after an arsenic implant and anneal.

After deglassing and cleaning, a further emitter implant (an unmasked blanket implant) is carried out at a dose of $1E16$ arsenic ions/cm² and at 100 keV, and is driven for 60 minutes at 975° C. in $N_2$ and for 30 minutes at 975° C. in $O_2$, forming a higher surface concentration region 95 for emitter regions 40 and 41, and to allow a subsequent link to P+ regions 50 (FIG. 10).

Figure 11:
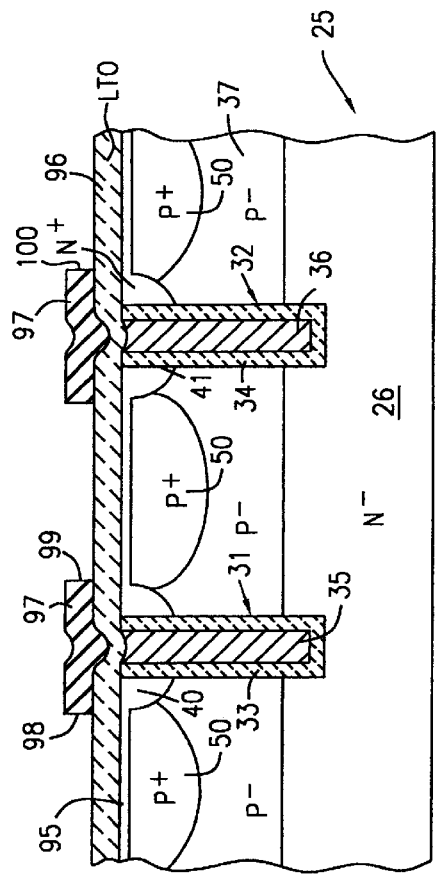
FIG. 11 shows the structure of FIG. 10 after an LTO deposition and the formation of a contact mask.

As next shown in FIG. 11, a low temperature oxide layer 96 such as TEOS is deposited and a contact mask 97 is formed thereon and is photolithographically processed to define windows 98, 99, 100.

Figure 12:
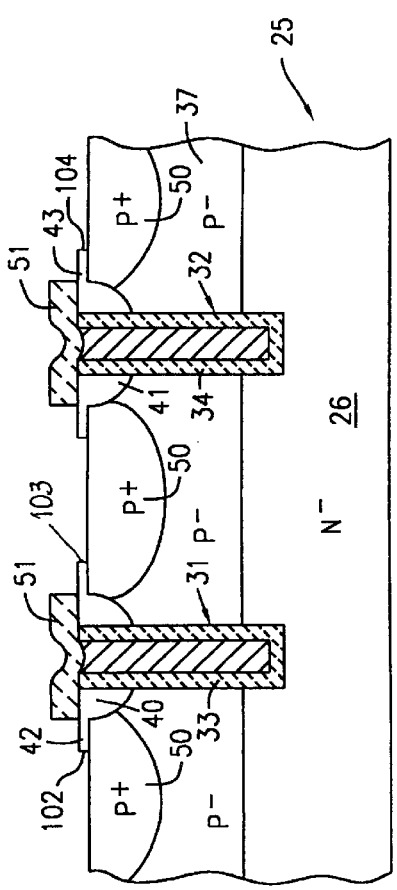
FIG. 12 shows the structure of FIG. 11 after an oxide etch and silicon etch and photoresist strip.

Thereafter, and as shown in FIG. 12, an oxide etch removes the exposed LTO, leaving segments 51 atop the trench regions to insulate the polysilicon gates from the contact to be deposited on the wafer surface. A silicon etch is also carried out to etch shallow contact windows 102, 103 and 104 through diffusion 95 of FIG. 11, defining ledges 42 and 43 in FIG. 12, and into P+ regions 50.

Figure 13:
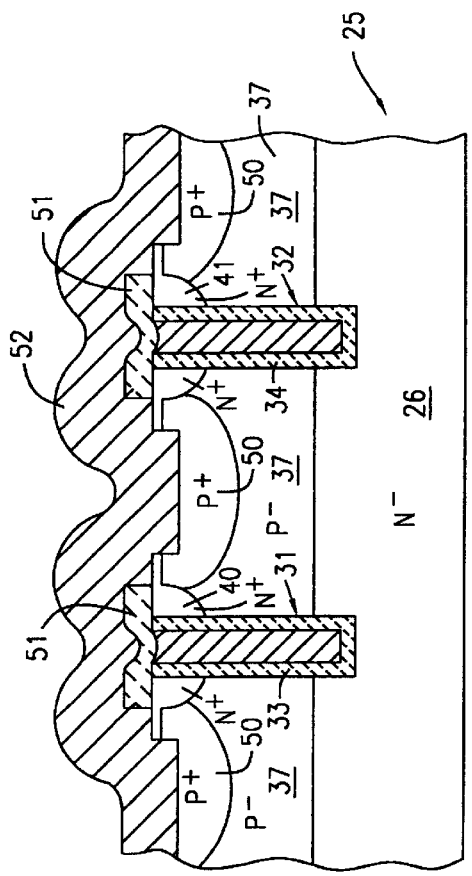
FIG. 13 shows the structure of FIG. 12 after the formation of the emitter contact, and after wafer thinning.

Thereafter, and as shown in FIG. 13, aluminum emitter electrode 52 is sputtered atop the wafer surface to a depth of about 4 microns. The emitter makes low resistance contact to P regions 50 and emitters 40 and 41. The aluminum contact 52 is then masked and etched to define the desired contact pattern, including gate buses and termination regions (not shown).

The wafer is next thinned by backside grinding and etch stress relief. Thereafter, the wafer may be processed to kill or reduce lifetime in the P− wells 37 as by a helium implant at the depth of P− regions 37. This implant have depth of 2 to 4 microns into the P wells 37, using a dose of $5E10$ to $2E11/cm^2$.

Next, a collector P+ backside implant 54 is applied to the backside surface (FIG. 1) at $1E14$ boron ions/cm² at 50 keV and is annealed. A AlTiNiVAg back contact 53 is then applied to the bottom surface.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An emitter diffusion geometry for a trench IGBT device; said trench IGBT having at least two spaced trenches extending into the upper surface of a chip of semiconductor material; said trenches having interior vertical surfaces which are lined with a gate insulation and which are filled with conductive gate material; said trenches extending through a channel diffusion of a first conductivity type for a given portion of their length; a plurality of identical emitter diffusion regions of the other of the conductivity types extending into said chip from the top of said channel diffusion and adjacent to said trenches from the top of said chip and for a given depth as measured along the vertical surfaces of said trenches; said emitter regions having a lateral width at the top of said channel region; adjacent respective ones of said two spaced trenches being spaced from one another by a contact surface; said contact, surface being interposed between adjacent ones of said emitter diffusions which extend toward one another in the channel space between adjacent trenches; said emitter regions having geometry whereby their depth from the top of said chip is greater than their said lateral width.

2. The device of claim 1 wherein said emitter regions have a depth of 2 to 4 microns and a lateral width of 1.5 to 3 microns, and wherein said depth is greater than said width.

3. The device of claim 1, which further includes an emitter metal electrode extending over and in contact with the top surface of said chip and in contact with said emitter regions and said channel regions.

4. The device of claim 2, which further includes an emitter metal electrode extending over and in contact with the top surface of said chip and in contact with said emitter regions and said channel regions.

5. The device of claim 3, wherein said emitter regions have shallow lateral extensions facing further away from their respective trenches to provide an increased contact surface to contact said emitter metal.

6. The device of claim 3, wherein the top surface of said emitter regions each have further high concentration shallow diffusions of said other of the conductivity types.

7. The device of claim 4, wherein said emitter regions have shallow lateral extensions facing away from their respective trenches to provide an increased contact surface to contact said emitter metal.

8. The device of claim 7, wherein the top surface of said emitter regions each have further high concentration shallow diffusions of said other of the conductivity types.

9. The device of claim 1, wherein said trenches have a depth of from 4 to 9 microns and are spaced by about 5 to 10 microns and have a width of about 1.5 microns.

10. The device of claim 1, wherein said first conductivity type is N.

11. The device of claim 1, wherein said trenches are laterally spaced straight parallel trenches.

12. The device of claim 1, wherein said trenches are multi-sided polygons in cross-section through the depth of said trenches.

13. The device of claim 2, wherein said trenches have a depth of from 4 to 9 microns and are spaced by about 5 to 10 microns and have a width of about 1.5 microns.

14. The device of claim 3, wherein said trenches have a depth of from 4 to 9 microns and are spaced by about 5 to 10 microns and have a width of about 1.5 microns.

15. The device of claim 5, wherein said trenches have a depth of from 4 to 9 microns and are spaced by about 5 to 10 microns and have a width of about 1.5 microns.

16. The device of claim 6, wherein said trenches have a depth of from 4 to 9 microns and are spaced by about 5 to 10 microns and have a width of about 1.5 microns.

17. The device of claim 7, which further includes a further diffusion of a first conductivity type into said channel region and having a higher concentration than that of said channel region; said further diffusion extending under said lateral extensions of said emitter regions and making contact to said emitter metal.

18. A trench IGBT comprising a body of monocrystaline silicon of one of the conductivity types and having a parallel top and bottom surfaces; a plurality of spaced trenches extending perpendicularly into said top surface for a given depth; a gate insulation layer lining the vertical walls of said trenches; a lightly doped channel diffusion of the other conductivity type formed between each of said trenches and having a depth which is less than the depth of said trenches; an emitter diffusion of said one of the conductivity types extending from said top surface of said body and along an upper portion of each of said trenches; said emitter diffusions being spaced from one another by a given distance between said trenches; a shallow contact diffusion of said other conductivity type which has a high concentration compared to that of said channel diffusion and disposed between adjacent pairs of said emitter diffusions; each of said emitter diffusions having a small lateral extent which is less than its depth; a collector diffusion of said other conductivity type in said bottom surface; an emitter metal electrode in contact with said emitter and channel diffusions and a collector electrode in contact with said collector diffusion.

19. The device of claim 18, wherein said emitter regions have a depth of 2 to 4 microns and a lateral width of 1.5 to 3 microns, and wherein said depth is greater than said width.

20. The device of claim 18, wherein said emitter diffusions have shallow lateral extensions facing away from their respective trenches to provide an increased contact surface to contact said emitter metal.

21. The device of claim 19, wherein said emitter diffusions have shallow lateral extensions facing away from their respective trenches to provide an increased contact surface to contact said emitter metal.

22. The device of claim 18, wherein the top surface of said emitter diffusions have a high concentration shallow diffusions of said other of the conductivity types.

23. The device of claim 21, wherein the top surface of said emitter diffusions have a high concentration shallow diffusions of said other of the conductivity types.

24. The device of claim 18, wherein said trenches have a depth of from 4 to 9 microns and are spaced by about 5 to 10 microns and have a width of about 1.5 microns.

25. The device of claim 20, wherein said trenches have a depth of from 5 to 9 microns and are spaced by about 5 to 6 microns and have a width of about 1.5 microns.

26. The device of claim 23, wherein said trenches have a depth of from 4 to 9 microns and are spaced by about 5 to 10 microns and have a width of about 1.5 microns.

27. The device of claim 18, wherein said trenches are laterally spaced straight parallel trenches.

28. The device of claim 18, wherein said trenches are multi-sided polygons in cross-section through the depth of said trenches.

29. The device of claim 2, wherein said trenches have a depth of about 6.5 microns and wherein said trenches are deeper than said channel diffusion by about one micron.

30. The device of claim 13, wherein said trenches have a depth of about 6.5 microns and wherein said trenches are deeper than said channel diffusion by about one micron.

31. The device of claim 18, wherein said trenches have a depth of about 8 microns and wherein said trenches are deeper than said channel diffusion by about one micron.

32. The device of claim 23, wherein the top surface of said emitter regions each have further high concentration shallow diffusions of said other of the conductivity types.

33. The device of claim 24, wherein the top surface of said emitter regions each have further high concentration shallow diffusions of said other of the conductivity types.

* * * * *